United States Patent [19]

Monahan

[11] 4,264,268

[45] Apr. 28, 1981

[54] APPARATUS FOR AND METHODS OF ORIENTING AND CENTERING AN ARTICLE HAVING LATERAL PROTRUSIONS

[75] Inventor: Jack J. Monahan, Allentown, Pa.

[73] Assignee: Western Electric Co., Inc., New York, N.Y.

[21] Appl. No.: 61,954

[22] Filed: Jul. 30, 1979

[51] Int. Cl.³ .............................................. B25J 3/00
[52] U.S. Cl. .................................... 414/754; 198/394
[58] Field of Search ............... 414/781, 754, 758, 755; 198/394, 388, 383, 390

[56] References Cited

U.S. PATENT DOCUMENTS

| | | | |
|---|---|---|---|
| 3,344,900 | 10/1967 | Drop .................................... | 198/394 |
| 3,367,476 | 2/1968 | Aronstein et al. .................... | 198/394 |
| 3,503,527 | 3/1970 | Devol ................................... | 414/758 |
| 3,776,394 | 12/1973 | Miller ................................... | 414/755 |
| 3,946,931 | 3/1976 | Bahnck et al. ....................... | 228/102 |
| 4,029,536 | 6/1977 | Kovacs et al. ....................... | 156/285 |
| 4,062,462 | 12/1977 | Hentz .................................... | 414/786 |

Primary Examiner—Robert J. Spar
Assistant Examiner—Kenneth Noland
Attorney, Agent, or Firm—W. O. Schellin

[57] ABSTRACT

An article (11) which has a body portion (12) and lateral protrusions (14) at fixed angular positions is oriented and centered with respect to predetermined axes. Sloped walls (61) of a plurality of channels (62) located about a central axis (24) engage lateral edges of the protrusions to urge the protrusions laterally toward desirable positions in relationship to the axes. The disclosed methods and apparatus are advantageously applied to a four-leaded electronic chip as a typical example of the article with respect to which orienting and centering offers desirable precision for handling such article during packaging operations.

9 Claims, 6 Drawing Figures

APPARATUS FOR AND METHODS OF ORIENTING AND CENTERING AN ARTICLE HAVING LATERAL PROTRUSIONS

TECHNICAL FIELD

This invention relates to apparatus for and methods of orienting and centering an article having lateral protrusions. More particularly, the invention relates to apparatus for and methods of orienting and centering an electronic article having laterally protruding leads, such as, for example, a beam-lead semiconductor device.

BACKGROUND OF THE INVENTION

In the evolution of semiconductor manufacturing techniques from a mystifying art to a highly cost-effective, sophisticated technology, a continuing engineering effort has been exerted on the simplification and automation of semiconductor chip packaging operations. Such packaging operations differ from semiconductor device processing steps in that the device processing steps are typically performed while the devices are still arrayed as integral portions of a unitary, relatively large wafer. In packaging operations, on the other hand, the devices are typically handled as individual devices or chips, in other words, as separate small portions formed by incremental division of such wafers.

In handling or bonding the chips in the course of packaging them to make completed components, manual handling of the individual chips is still not uncommon. Operators are commonly engaged in aligning the chips to bond sites on substrates, or aligning leads or contact pads with respect to reticles or alignment marks. Typically the devices are viewed through microscopes to perform such alignment operations. Since such manual alignment operations are both cumbersome and costly in terms of operator time, it is desirable to automate the alignment operations whenever possible.

U.S. Pat. No. 3,946,931 to Bahnck et al. discloses an apparatus for bonding an article to a substrate. Automatic alignment features shown in the patent are examples of recent progress made toward automating typical handling and alignment techniques. The apparatus described in the Bahnck et al. patent orients and centers beam-lead chips by a technique which uses what is known as a centering cavity. The cavity has the form of a truncated, inverted pyramid, with a square cross section which downwardly decreases in size. The upper opening of the cavity is wide enough to accommodate the lateral extent of beam-lead chips and any anticipated lateral deviation from a desired center as well as any expected angular misorientation with respect to a desired orientation.

U.S. Pat. No. 3,982,979 to Hentz et al. discloses in detail the function of the centering cavity. One of the beam-lead chips to be centered is placed onto a central and axially reciprocable pedestal. The pedestal may have, in addition, a vacuum provision for temporarily holding the chip. The chip starts to orient and center itself against the sloped sides of the cavity when the outer tips of the beam leads contact the sloped inner surfaces of the cavity. On a typical beam-lead integrated circuit chip, a plurality of the tips of the beam-leads terminate along straight lines parallel to each of the four edges of the chip. When the chip is centered and properly oriented, each line of lead tips is positioned adjacent to and typically in contact with a respective one of the sloped walls of the cavity.

It has been a long standing problem that the walls of such a cavity are unreliable for orienting a chip when the chip has only one lead extending from each edge of the chip. The tip of such a single lead fails to form a clearly defined termination line parallel to the respective edge of the chip to which the chip may be oriented. Even when a chip has two leads extending from one of the surfaces and only a single lead extending from one of the other edges of the chip, the tips of the leads being guided against the sloped surfaces of the inverted truncated pyramid have a tendency to rotate the chip randomly away from a desired orientation. Heretofore, beam-lead chips having four or fewer leads with only one lead extending from at least one edge have therefore been centered by manual techniques. These manual techniques have kept packaging costs of such chips higher than those of similar chips being packaged by automated alignment techniques.

SUMMARY OF THE INVENTION

It is consequently an object of the invention to orient and center articles having lateral protrusions by apparatus and methods which do not exhibit a tendency to randomly rotate such articles away from a desired orientation.

A more specific object of the invention is to provide methods of and apparatus for automatically aligning beam-leaded chips without using the tips of the leads as an alignment reference.

Accordingly, the invention pertains to orienting and centering an article having a body portion from which extend lateral protrusions at fixed angular positions. Apparatus for orienting and centering such article includes a base having an aperture therein. The aperture is considered to be centered on a hypothetical vertical axis therethrough. The aperture is also of a size capable of receiving the body portion of the article such that at least portions of the lateral protrusions extend beyond lateral boundaries of the aperture. Provision is made for lowering the article into and raising the article from the aperture. A provision for engaging side surfaces of the protrusions is located adjacent to the periphery of the aperture. Such engagement is contemplated during the lowering of the article into the aperture. A resulting urging force on the engaged protrusions orients the article and locates the protrusions in predetermined loci with respect to the axis, whereby the article becomes oriented and centered on the axis.

A method according to the invention, whereby an article having a body portion and lateral protrusions at fixed angular positions becomes oriented and centered includes lowering the article into an aperture and engaging at least one of the protrusions laterally and perpendicularly to the lateral extent of the protrusions to generate an urging force on the article. The urging force shifts the protrusions toward predetermined loci while the article is lowered into the aperture.

BRIEF DESCRIPTION OF THE DRAWING

The following detailed description will be better understood when reference is made to the accompanying drawing, wherein.

DETAILED DESCRIPTION

A Typical Article

Figure 1:
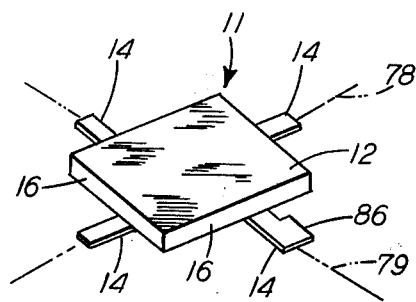
FIG. 1 is a pictorial view of a typical article which is advantageously oriented and centered in accordance with the present invention.

FIG. 1 depicts an electronic beam-lead chip 11 as an example of a typical article which may be handled advantageously by employing the features of the present invention. However, even though the following description of the various features of this invention makes reference to the chip 11, such reference should not be construed as a limitation on the scope of the present invention.

The chip 11 shows in FIG. 1 has a body portion 12 from which extend leads 14 as lateral protrusions. In the particular example of the chip 11, the leads 14 are shown to extend from all four major edges 16 of the chip 11. The angular relationship of the leads 14 and also the number of the leads 14 which extend from each of any group of a particular type of chip are fixed. However, among different types of chips such angular relationship and the number of the leads 14 may vary.

The number of terminals or leads 14 of any particular chip 11 depends, of course, on the design function of the chip. For instance, simple transistor chips 11 may have only three leads 14, two of which may extend from a first one of the edges 16 of the body portion, while the third lead may extend from a second edge, usually opposite said first edge, of the body portion 12.

Another type of chip 11 has the four-leaded configuration illustrated in FIG. 1. Since the preferred embodiment of the invention relates to orienting and centering such four-leaded chips 11, the invention is primarily described with respect to such four-leaded chips 11. However, as will become apparent from the further description of the invention, modifications to center and orient chips having different lead configurations also fall within the scope of this invention.

The Apparatus in General

Figure 2:
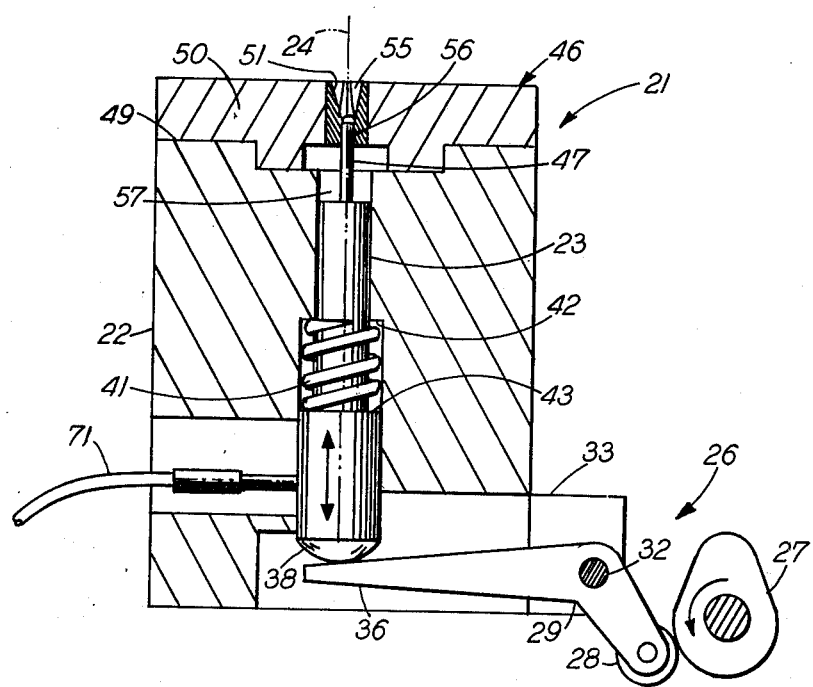
FIG. 2 is a sectional view of apparatus incorporating features of the present invention.

In FIG. 2, a structure, designated generally by the numeral 21, represents a typical and preferred embodiment of an apparatus for orienting and centering a chip 11 in accordance with the present invention. Some of the operational features of the apparatus 21 are similar to those of prior art apparatus. Thus, the apparatus 21 includes a base 22 in which a ram or plunger 23 is slidably mounted to permit the plunger 23 to undergo reciprocating motion along a vertical, central axis 24 of the base.

The reciprocating motion of the plunger 23 is preferably generated by a commonly used cam-lever mechanism 26 in which a rotary driven cam 27 alternately advances against, and then recedes from, an end 28 of a cam follower-lever 29. The lever 29 is typically pivotally mounted in a bearing 32, which in turn is mounted to a support 33. The support 33 is stationary with respect to the base 22. A driver end 36 of the lever 29 bears against a lower end 38 of the plunger 23 to drive the plunger 23 upward in response to an advance of the cam 27 against the end 28 of the lever 29.

The plunger 23 is spring-biased downward within the base 22, so that the plunger 23 is urged or forced downward within the base 22 during a receding cam motion. The bias force on the plunger 23 also maintains the plunger 23 in contact with the driver end 36 of the lever 29 and maintains the end 28 of the lever 29 in contact with the cam during the receding motion part of the rotational cycle of the cam. The bias force on the plunger 23 is typically generated by a spring 41 acting against a shoulder 42 on the base 22 and on an opposing shoulder 43 on the plunger 23.

A top portion 46 of the structure 21 incorporates features which orient and center the chip 11 in accordance with the present invention. Such orienting and centering requires the cooperating motion of the plunger 23. An upper end 47 of the plunger 23 consequently protrudes substantially through the top portion 46 when the cam 27 has advanced furthest against the lever 29.

In the preferred embodiment shown in FIG. 2, the top portion 46 is a separate structural element which is solidly but removably mounted to a top surface 49 of the base 22. Typically, the top portion 46 is held to the base 22 by screws (not shown). The top portion 46 including the orienting and centering features to be described hereunder could, of course, be a unitary portion of the base 22. However, separately mounting the top portion 46 offers distinct advantages including adjustment and interchangeability of the top portion 46.

The Orienting and Centering Guide

Figure 3:
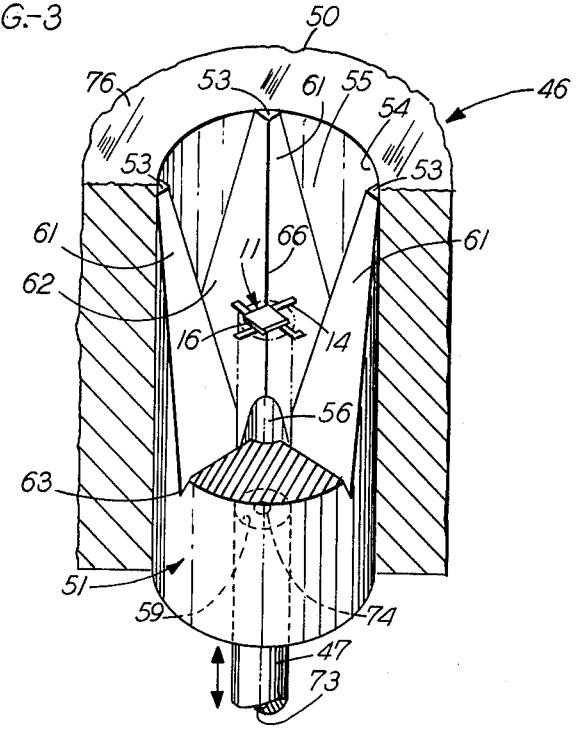
FIG. 3 is an enlarged view of a portion of the apparatus of FIG. 2, showing a central aperture occupied by an upper end of a plunger.

The top portion 46 is a compound structural element which includes a peripheral flange 50 and a centrrally inserted crown-like orienting and centering guide 51. A preferred embodiment of the guide 51 is shown in greater detail in FIG. 3. The guide 51 shown is particularly adapted to orient and center the chip 11 having the four leads 14 extending from four orthogonal edges 16 thereof.

The guide 51 is distinct from the inverted truncated pyramidal shapes of prior art cavities in that upwardly tapered prongs 53 (FIG. 3) adjoin and terminate against a cylindrical wall 54 of a cavity 55. The cavity 55 extends centrally through the flange 50 of the top portion 46. Because of the relationship of the guide 51 to the shape of the chip 11, there are preferably four equally spaced prongs 53.

The prongs are radially arranged about a central aperture 56 through the guide 51. Referring back to FIG. 2, the aperture 56 communicates with a central passage 57 of the base 22 wherein the plunger 23 is housed. The upper end 47 of the plunger 23, being of a diameter slightly smaller than the diameter of the aperture 56, moves in its reciprocating motion past the prongs 53. A chip 11 placed on a platform 59 (See also FIG. 4) at the upper end 47 of the plunger moves downwardly past the prongs 53 as the plunger 23 recedes downward through the aperture 56.

Figure 4:
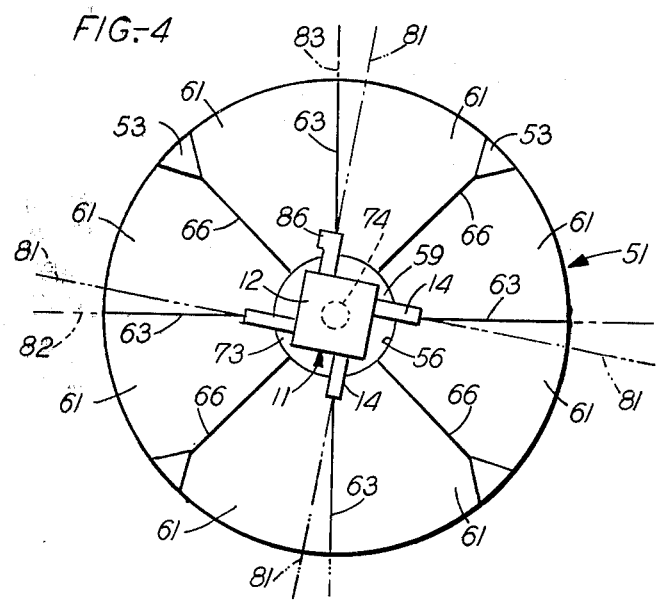
FIG. 4 is a top view of a central portion of the apparatus of FIG. 2, showing in addition an article such as the one in FIG. 1, in the process of becoming oriented in accordance with this invention.

Referring again to FIG. 3 and also to FIG. 4, the aperture 56 is slightly larger than the largest dimension of the body portion 12 of the chip 11. However, the leads 14 protrude laterally past the vertical confines or boundaries of the aperture 56. The leads 14 may therefore move into interfering engagement with the prongs 53 as the chip 11 descends together with the receding plunger 23 toward the aperture 56.

Each of the prongs 53 has two sloped surfaces 61. Each of such surfaces 61 is located opposite from a similar surface 61 of one of the adjacent prongs 53. Two opposite surfaces 61 form downwardly converging walls of a common channel 62 with downwardly decreasing width. A preferred slope of the surfaces 61 is 15° from a vertical plane. At such an angle the surfaces 61 have been found to generate a lateral urging force on the leads 14 to shift the chip 11 laterally as the chip 11 is moved vertically past the prongs 53. Of course variations from the preferred slope would be acceptable and could even prove to be superior with variations in the vacuum pull on the chip 11 as will be described hereinafter. The channels 62 formed by the surfaces 61 of the prongs 53 terminate in a horizontal intersecting line 63 between such surfaces 61.

The two sloped surfaces 61 of each particular one of the prongs 53 also intersect along a common edge or ridge 66. The ridges 66 slope upwardly and outwardly from the aperture 56 toward the wall 54. It has been observed that such ridges 66 contribute advantageously to orienting and centering the chip 11 when the chip 11 is placed on the platform 59 of the plunger 23 with an initial, rather extreme misalignment from a desirably oriented and centered position. The ridges 66 tend to engage any projecting portion of the chip 11, which could be an edge of the body portion 12 or any projecting portion of any of the leads 14 of the chip, to urge such engaged portion toward the axis 24 of the apparatus 21.

The Operation of the Apparatus

In the operation of the apparatus 21, achieving a proper orientation and centered position of the chip 11 is dependent on the functional interrelation between the surfaces 61, the ridges 66 and the motion of the plunger 23. The motion of the plunger 23 brings about the engagement of portions of the chip 11 with such surfaces and ridges to effectuate a desired orientation and centered position of the chip 11.

As in some known centering devices, the plunger 23 is connected through an appropriate line 71 (see FIG. 2) to a vacuum source, which is not shown. A central, vertical passage 73 (see FIG. 3) through the plunger 23 terminates in an opening 74 in the platform 59. The vacuum may be selectively switched on and off to aid in centering and orienting the chip 11. The typical operational cycle of the plunger 23 is quite like that of plungers or rams in known centering mechanisms, as for instance the operational cycle of the tubes described in the aforementioned U.S. Pat. No. 3,982,979 to L. J. Hentz et al., which is assigned to the assignee of this application. The motion of the plunger 23 may be generated by a linear cam structure such as one taught by U.S. Pat. No. 4,029,536 to E. Kovacs et al., which is also assigned to the assignee of the present application. However, the present invention is described in relationship to the apparatus 21 which is preferably operated by a rotary cam. Also, any vacuum ports which permit a vacuum suction at the opening 74 in the platform 59 are preferably selectively opened and closed by conventional commercially available solenoid valves, such as those typically used in various kinds of semiconductor handling apparatus.

A typical orienting and centering cycle of the apparatus 21 begins with the plunger 23 being in a raised position, such that the platform 59 is located even with, or slightly above, an upper surface 76 (see FIG. 3) of the top portion 46. The chip 11 is typically transferred at that time to the platform 59 by any one of a number of equally acceptable transfer mechanisms, such as, for instance, a chip transfer apparatus which is commercially available from Teledyne TAC under the tradename "Minisorter." Similar to other chip handling apparatus, such a transfer mechanism uses a selectively operted vacuum, which is typically operated through the combination of a timed electric switch and a solenoid-operated valve.

With the plunger being located in the raised position the chip 11 is deposited on the platform 59 by a chip holder of such typical transfer mechanism (not shown). The vacuum is preferably turned on to what is referred to as a "high vacuum" during the transfer of the chip 11 from the chip holder to the platform. Such a "high vacuum" lies typically in a range about 460 mm Hg. In making a transfer of a chip 11 from one vacuum aided chip holder to another, it is considered to be a good practice to maintain a slight overlap of the vacuum in each of the holders involved in the transfer. Such an overlap tends to avoid any undesirable lateral slippage of the chip with respect to the holders involved in such transfer.

After the chip 11 has been deposited on to the platform 59, the plunger 23 begins to recede from its uppermost position toward the base 22, carrying the chip 11 downwardly past the sloped surfaces 61 of the guide 51. At the onset of the downward motion, the vacuum holding the chip 11 to the platform 59 is reduced from the initial "high vacuum" to what is referred to as a "low vacuum." Typically the "low vacuum" draws a mercury column of only 50 to 130 mm Hg. The reduced vacuum pull through the plunger 23 prevents the chip 11 from hanging up against the surfaces 61 or the ridges 66 as portions of the chip 11 make contact therewith in the process of orienting and centering the chip 11 while permitting the chip to move laterally with respect to the plunger. As the chip 11 recedes toward the base 22, being slightly urged against the platform 59 of the plunger, the widths of the channels 62 become increasingly narrow. Ultimately the chip 11 reaches a level at which the width of each lead 14 equals the width of the respective channel 62. At this level the leads 14 have reached the desired position and the chip 11 has become oriented and centered.

The motion of the plunger is typically adjusted to recede only to the point at which the chip 11 reaches such lowermost level. The motion of the plunger further includes a "bump" or vertical oscillation of a typical amplitude of 0.1 to 0.15 mm to engage and jar the chip 11. Such a jar eliminates or minimizes a tendency of the chip 11 to rest against two or more of the surfaces 61 and thereby to fail to reach the lowermost level of the channels 62.

When the chip 11 is oriented and centered as described herein, the "high vacuum" is turned on to seat the chip 11 against the platform 59 of the plunger 23 as the plunger is raised to its uppermost position to present the oriented and centered chip 11 to the transferring chip holder of the transfer apparatus.

Special Characteristics and Alternate Embodiments

The desired orientation as well as the desired centered position of the chip 11 is achieved when the chip 11 has reached the described lowermost level at which the leads 14 become arrested in their downward movement by the engaging surfaces 61 on both sides of the channel. The orientation and centering process functions most efficiently when the four leads 14 extend pairwise perpendicular to each other. By moving each of the leads 14 to a predetermined position, mutually perpendicular axes 78 and 79 become shifted (see FIG. 1) to center the chip 11 on the vertical axis 24 through the apparatus 21. However, because of a typical offset of each of the leads 14 from orthogonal reference axes 81 through the chip 11, the final orientation of the chip 11 is rotated with respect to axes 82 and 83 (see FIG. 4) through the center of the diametrically opposite channels 62 between each of the prongs 53. Such a rotation in the orientation of the chip 11 is compensated for by rotating the prongs 53 initially through an equal angle away from a desired orthogonal orientation to achieve a final desired orthogonal orientation of the chip 11.

It should also be noted here that one of the leads 14 of the chip 11 typically carries an identifier flag 86 (see FIG. 1). The presence of the flag 86 on one of the leads identifies the electrical functions, e.g., input, output of signals, or ground or supply voltage inputs, of all of the leads 14 by their positions in relationship to the flagged lead. However, the presence of the flag 86 on the one lead 14 also widens such one lead in relationship to the other leads. During the described orienting and centering operation the flagged lead 14 tends to become arrested in its downward movement before the other three leads 14 become similarly arrested by the surfaces 61 of the channels 62. Consequently, in the preferred embodiment of the apparatus 21, the chip 11 assumes a slightly tilted position in the lowermost position in which the chip becomes centered and oriented. It has been found, however, that this tilted position straightens as the plunger 23 engages the chip 11 on returning to the uppermost position after the process of orienting and centering the chip 11 has been completed.

It has further been found that when a plurality of the chips 11 assume the tilted positions in succession and become raised to a level position by the plunger 23, no significant error is introduced, as a deviation in the orientation and centering between any of the chips 11 with respect to the remaining chips. In other words, the repetitive accuracy of the apparatus 21 is maintained even though the widths of all channels and their relative positions do not take into consideration a greater width (typically greater by about 50%) of one of the leads 14 and the angular offset of all the leads 14 from an orthogonally centered position.

The preferred simplified guide 51 is consequently sufficiently accurate to locate and orient a succession of the chips 11 with no discernible error when the aligned and oriented positions of the chips 11 are viewed under a microscope with a typical magnification employed for optical comparison. However, it is not to be implied that a modification of the guide 51 (shown in FIGS. 3 and 4) to compensate for the offset leads 14 and for the flag 86 is not desirable. Whether or not the guide 51 should include such a modification appears to be simply a question of cost.

Figure 5:
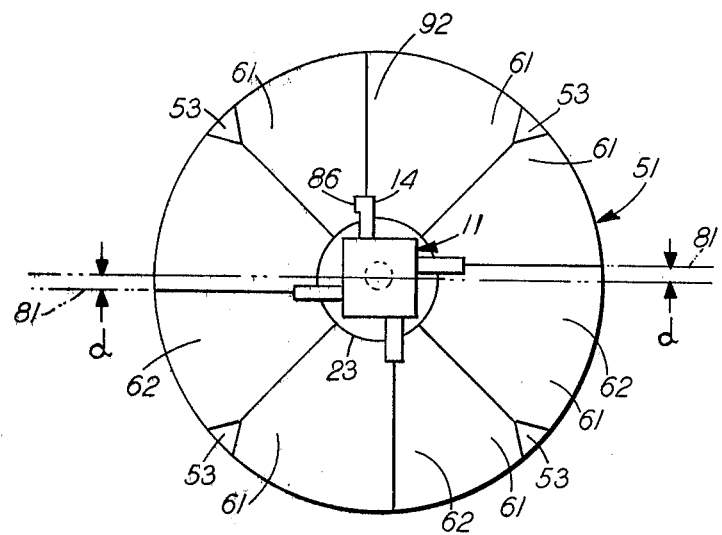
FIG. 5 is a top view of a portion of an apparatus similar to the apparatus of FIG. 2 showing an alternate embodiment of the invention.

FIG. 5 shows a top view of an alternate embodiment of the guide 51 which includes such a modification. A center of each of the channels 61 is offset from the orthogonal axes 81 through the vertical axis 24 by a distance indicated by the letter "d." The distance equals the dimensional offset of the leads 14 from true orthogonal axes on the chip 11. In addition, one of the channels shown in FIG. 5, designated by the numeral 92 is of a greater width than the remaining three channels 62. The wider channel 92 accommodates the flag 86 and the adjacent lead 14 at the same level at which the other channels 62 accommodate the width of the other three leads 14. The chip 11, oriented and centered by the alternate embodiment of the guide 51, becomes orthogonally positioned by the surfaces 61 of the prongs 53.

Figure 6:
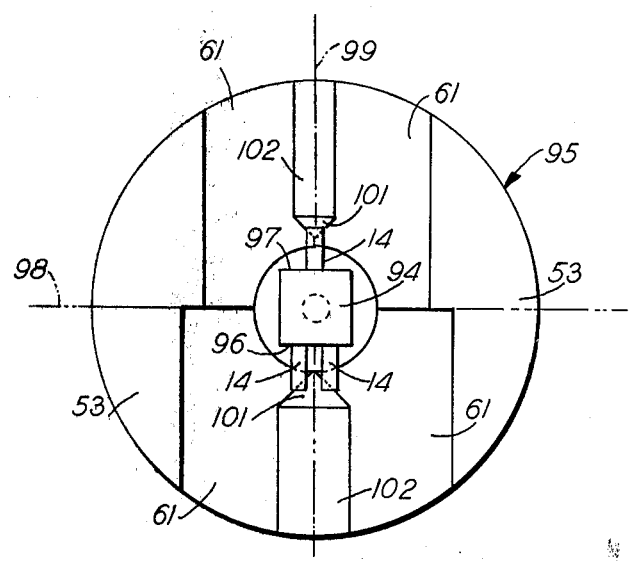
FIG. 6 is a top view of an apparatus similar to the apparatus of FIG. 2 which includes modifications particularly adapted for handling three-leaded articles.

A further embodiment of the invention is illustrated in FIG. 6, wherein a three-leaded chip 94 is shown in relationship to a guide 95. The leads of the chip 94, which are also designated by the numeral 14, are preferably arranged in a pattern in which two leads 14 extend from a first edge 96 of the typically square chip 94 and the third lead 14 extends from an edge 97 opposite therefrom.

The guide 95 is distinguished from the guide 51 in that the sloped surfaces 61 of the prongs 53 provide guiding pressure against the lateral edges of the leads 14 in only one directional dimension, e.g., in the direction of an axis 98 to shift the chip 94 perpendicularly to the longitudinal extent of the leads. Centering the chip 94 in the direction of an axis 99 is accomplished by sloped end surfaces 101 of walls 102 extending between the two prongs 53 located to either side of the axis 98.

In essence, the surfaces 101 function substantially as sloped centering surfaces of prior art centering cavities, namely by urging the tips of the leads 14 in the direction of the longitudinal extent of the leads 14 to center the chip 94 in that respective direction. However, the guide 95, in addition, urges the chip 94 in the direction perpendicular to the lengths of the leads 14 by an engagement of the surfaces 61 with the lateral edges of the leads 14. The two functions are combined in the guide 94 to produce the necessary urging forces to center and orient the chip 94 without the tendency of haphazard misorientation as it has been noticed on prior art centering cavities in attempts to center three-leaded chips.

From the above, it is apparent that various changes and modifications can be envisioned and applied to the disclosed embodiments, particularly to accommodate and handle various types of articles similar to the described chip 11 without departing from the scope and spirit of the present invention.

What is claimed is:

1. Apparatus for orienting and for centering an electrical article having a body portion and laterally protruding leads at fixed angular positions, which comprises:
    a base having an aperture therein, the aperture being centered on an axis perpendicular to a plane within which the leads extend, the aperture is defined by a lateral boundary which extends axially the aperture being of a size larger than the body portion of the article such that at least portions of the said leads extend beyond the lateral boundary of the aperture;
    means located in the aperture for lowering said article toward and for raising said article with respect to said aperture in a direction coincident with the axis; and
    channels located about the periphery of the aperture, said channels extending above and joining with the top of the aperture in a predetermined pattern, said channels coincide with the directional pattern in which the leads extend, each channel being defined by two downwardly converging sloped sidewalls, the downward continuations of which meet in horizontal intersection lines which lie in a plane perpendicular to the axis of the aperture, whereby the width of each of the channels decreases in a direction extending downwardly along the sidewalls, said sidewalls engaging side surfaces of at least one of the leads upon such article being lowered toward said aperture to urge such engaged lead in a direction substantially perpendicular to the lateral extension of such lead, such that the leads assume desirable loci within said channels and the leads extend longitudinally within said channels, whereby the article becomes centered with respect to the axis.

2. Apparatus according to claim 1, wherein the number of the channels correspond to the number of leads.

3. Apparatus according to claim 1, wherein the electronic article to be oriented and centered is a four-leaded article, the leads of which extend in four directions and the sideways are formed on four prongs located about the aperture, each prong having two sloped surfaces, each surface forming, in conjunction with one surface of an adjacent one of the prongs, the walls of one of the channels.

4. Apparatus according to claim 3, wherein one of the leads of the article to be oriented and centered has a width greater than that of the other leads and one of the channels is correspondingly of a greater width than the remaining ones of the channels when compared in any one horizontal plane through the channels.

5. Apparatus according to claim 3, wherein the leads of the article to be oriented and centered extend pairwise in opposite directions and each such pair is perpendicular to the other, and the channels are extending in orthogonal directions.

6. Apparatus according to claim 5, wherein the positions of the leads in each pair are linearly offset with respect to each other and the channels are similarly linearly offset with respect to each other.

7. A method of orienting and centering an electrical article having a body portion and electrical leads extending laterally outward at fixed angular positions from said body portion, the method comprising:
positioning the article above an aperture extending vertically into a base such that the leads of the article, are positioned above upper portions of laterally extending channels about the periphery of the aperture in a pattern coincident with the angular positions of the leads, each of said channels being bounded by pairwise downwardly converging guide surfaces, to guide said leads upon movement thereof at least partially into said channels;
moving said article relative to said guide surfaces in a direction along a central, longitudinal axis extending through such aperture into the base and the convergence of such guide surfaces, the downward continuations of which meet in horizontal intersection lines which lie in a plane perpendicular to the axis of the aperture and
bringing said guide surfaces into gradual, interfering contact with lateral portions of said leads, such contact tending to shift said leads perpendicular to the length of the leads and to the direction of such relative movement, whereby the leads become increasingly laterally restricted from movement between the converging guide surfaces of each of the channels and the article becomes centered on said longitudinal axis.

8. A method according to claim 7, wherein the article has four electrical leads extending in orthogonal directions within a plane, and moving said article relative to said guide surfaces comprising establishing relative motion in a direction perpendicular to the single plane in which the leads extend, and in the direction of convergence of the guide surfaces.

9. A method according to claim 7, wherein the article comprises four electrical leads, said leads extending in four, pairwise perpendicular directions, and positioning the article comprises:
transferring the article to a platform at one end of a longitudinally reciprocable plunger located along said longitudinal axis, said leads extending laterally beyond the platform; and
moving said article relative to said guide surfaces comprises moving the plunger in the direction of convergence of the surfaces, said surfaces thereby approaching lateral edges of said leads.

* * * * *

UNITED STATES PATENT AND TRADEMARK OFFICE
CERTIFICATE OF CORRECTION

PATENT NO. : 4,264,268
DATED : April 28, 1981
INVENTOR(S) : Jack Joseph Monahan

It is certified that error appears in the above-identified patent and that said Letters Patent are hereby corrected as shown below:

Column 3, line 27, "shows" should read --shown--.
Column 4, line 39, "centrrally" should read --centrally--.
Column 4, line 55, after "prongs" insert --53--. In the claims, Column 8, claim 1, line 58, after "axially" insert --,--. Column 9, claim 3, line 24, "sideways" should read --sidewalls--. Column 10, claim 7, line 14, after "and" insert --toward--. Column 10, claim 8, line 31, "comprising" should read --comprises--.

Signed and Sealed this

Twenty-fifth Day of August 1981

[SEAL]

Attest:

Attesting Officer

GERALD J. MOSSINGHOFF

Commissioner of Patents and Trademarks